(12) United States Patent
Uzuka

(10) Patent No.: US 6,541,855 B2
(45) Date of Patent: Apr. 1, 2003

(54) PRINTED BOARD UNIT

(75) Inventor: Yoshinori Uzuka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/790,697

(22) Filed: Feb. 23, 2001

(65) Prior Publication Data

US 2002/0036341 A1 Mar. 28, 2002

(30) Foreign Application Priority Data

Sep. 25, 2000 (JP) ........................................ 2000-291143

(51) Int. Cl.[7] .............................................. H01L 23/10
(52) U.S. Cl. ...................... 257/712; 257/718; 257/778
(58) Field of Search ................................ 257/712, 713, 257/737, 738, 778, 718, 719

(56) References Cited

U.S. PATENT DOCUMENTS 5,883,788 A    3/1999    Ondricek et al.
6,325,552 B1 * 12/2001    Brillhart ..................... 385/88

FOREIGN PATENT DOCUMENTS

JP    7-312242    11/1995
JP    10-135379    5/1998

* cited by examiner

Primary Examiner—Roy Potter
(74) Attorney, Agent, or Firm—Staas & Halsey LLP

(57) ABSTRACT

A printed board unit includes a printed board including lands thereon, a semiconductor device unit, and an attachment mechanism to attach the semiconductor device unit to the printed board. The semiconductor device unit includes a heat transfer member, a semiconductor device including first and second surfaces parallel to each other, the first surface having lands thereon, and a socket including contacts protruding from first and second surfaces of the socket, the first and second surfaces being parallel to each other. In the semiconductor device unit, the semiconductor device and the socket are attached to the heat transfer member so that the second surface of the semiconductor device opposes the heat transfer member. The lands of the semiconductor device are electrically connected to the lands of the printed board unit via the contacts of the socket.

20 Claims, 15 Drawing Sheets

PRINTED BOARD UNIT

BACKGROUND OF THE INVENTION

1. Field of the Invention

The present invention generally relates to printed board units, and more particularly to a printed board unit which includes a large scale integration (LSI) package of a land grid array (LGA) type mounted on a printed board with an LGA socket interposed therebetween, and forms a server that is an information processing and communication facility.

A printed board unit forming a server is plugged into a motherboard in consideration of repairs in the event of a failure, and an LSI package is replaceably mounted on a printed board.

In the server, repairs are made with a printed board unit being removed from the server. During the repairs, the server operates with a reduced processing capacity compared with its normal state since the printed board unit is removed from the server. Therefore, it is desirable that the repairs should be made so quickly that a period for which the server operates with the reduced capacity compared with its normal state becomes as short as possible.

Further, like the above-described repairs, the additional installation of an LSI package on the printed board is also performed with a printed board unit being removed from the server. Therefore, it is also desirable that the additional installation of the LSI package should be quickly performed.

Moreover, it is desirable that the repairs should be made and the additional installation should be performed with the lowest possible costs.

2. Description of the Related Art

FIGS. 1 and 2 each show a conventional printed board unit 10. The printed board unit 10 includes an LGA-type LSI package 20 mounted on a printed board 11 with an LGA socket 30 interposed therebetween. A stiffener 40 is provided on the lower surface of the printed board 11 with an insulating sheet 45 interposed therebetween, and a heat transfer plate 41 that doubles as a cooling fin is provided on the upper surface of the LSI package 20. The printed board unit 10 further includes nuts 42, which are tightened so that the heat transfer plate 41 presses the LSI package 20 onto the printed board 11 through a heat transfer sheet 46 by coiled springs 43. Each of lands 21 of the LSI package 20 is electrically connected to a corresponding one of lands 12 formed on the printed board 11 via a corresponding one of contacts 31 of the LGA socket 30.

The printed board unit 10 is mounted on a motherboard by being plugged thereinto and is incorporated into a server.

Here, a description will be given of repairs in the event of a failure of the LSI package 20.

The repairs are made in the following procedure. In step 1, the printed board unit 10 is removed outside from the server. In step 2, at the site, the nuts 42 are loosened and removed, and the heat transfer plate 41 is pulled off the bolts 40a of the stiffener 40 so that the LSI package 20, the LGA socket 30, and the heat transfer plate 41 are apart from one another. In step 3, the faulty LSI package 20 is replaced with a new LSI package. In step 4, the LSI socket 30 is positioned on the printed board 11. In step 5, the new LSI package is positioned on the LSI socket 30. In step 6, the heat transfer plate 41 is combined with the stiffener 40 and the coiled springs 43 are fitted to the bolts 40a before the nuts 42 are tightened. In step 7, the printed board unit 10 is inserted into the server.

Repairs are also made in the above-described procedure in the event of a failure of the LGA socket 30.

Positioning the new LSI package on the LGA socket 30 requires accuracy, and is troublesome and relatively time-consuming. Therefore, the repairs of failures of the LSI package 20 and the LGA socket 30 are relatively time-consuming.

The additional installation of an LSI package also requires positioning the LSI package on an LGA socket, and therefore, is relatively time-consuming.

At some sites, dust attaches to the lands 21 of the LSI package 20 and the contacts 31 of the LGA socket 30 while the LSI package 20 and the LGA socket 30 are apart from each other so that the reliability of electrical connection between the LSI package 20 and the LGA socket 30 may be impaired.

In the event of a failure of an LSI package or an LGA socket, a new printed board unit may be fitted into the server after a printed board unit including the faulty LSI package or LGA socket is removed from the server, which method dispenses with the removal of the faulty LSI package or LGA socket.

The above-described method dispenses with the replacement of the faulty LSI package or LGA socket, thus realizing quick replacement of a faulty component. However, in order to realize this method, it is necessary to prepare a new printed board unit for replacement for each printed board unit, thus increasing the costs of spare components.

Similarly, in the case of the additional installation of an LSI package, it is necessary to prepare a new printed board unit for the additional installation, thus increasing the costs of spare components.

SUMMARY OF THE INVENTION

It is a general object of the present invention to provide a printed board unit in which the above-described disadvantages are eliminated.

A more specific object of the present invention is to provide a printed board unit which includes a semiconductor device unit as a replacement unit so as to be repaired and reproduced easily in a short time in the event of a failure only by replacing the semiconductor device unit.

The above objects of the present invention are achieved by a printed board unit including a printed board including lands thereon, a semiconductor device unit, and an attachment mechanism for attaching the semiconductor device unit to the printed board, wherein the semiconductor device unit includes: a heat transfer member; a semiconductor device including first and second surfaces parallel to each other, the first surface having lands thereon; and a socket including contacts protruding from first and second surfaces of the socket, the first and second surfaces being parallel to each other, wherein the semiconductor device and the socket are attached to the heat transfer member so that the second surface of the semiconductor device opposes the heat transfer member, and the lands of the semiconductor device are electrically connected to the lands of the printed board unit via the contacts of the socket.

According to the above-described printed board unit, the semiconductor device unit is a replacement unit. In the event of a failure of the semiconductor device, repairs are completed only by removing the semiconductor device unit including the faulty semiconductor device from the printed board unit and replacing the semiconductor device unit by a prepared new semiconductor device unit. Therefore, the positioning of the semiconductor device on the socket is unnecessary. Thus, the printed board unit is repaired in a shorter time than a conventional printed board unit, which requires a semiconductor device and a socket to be apart from each other for repair.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

A description will now be given, with reference to the accompanying drawings, of embodiments of the present invention.

Figure 1:
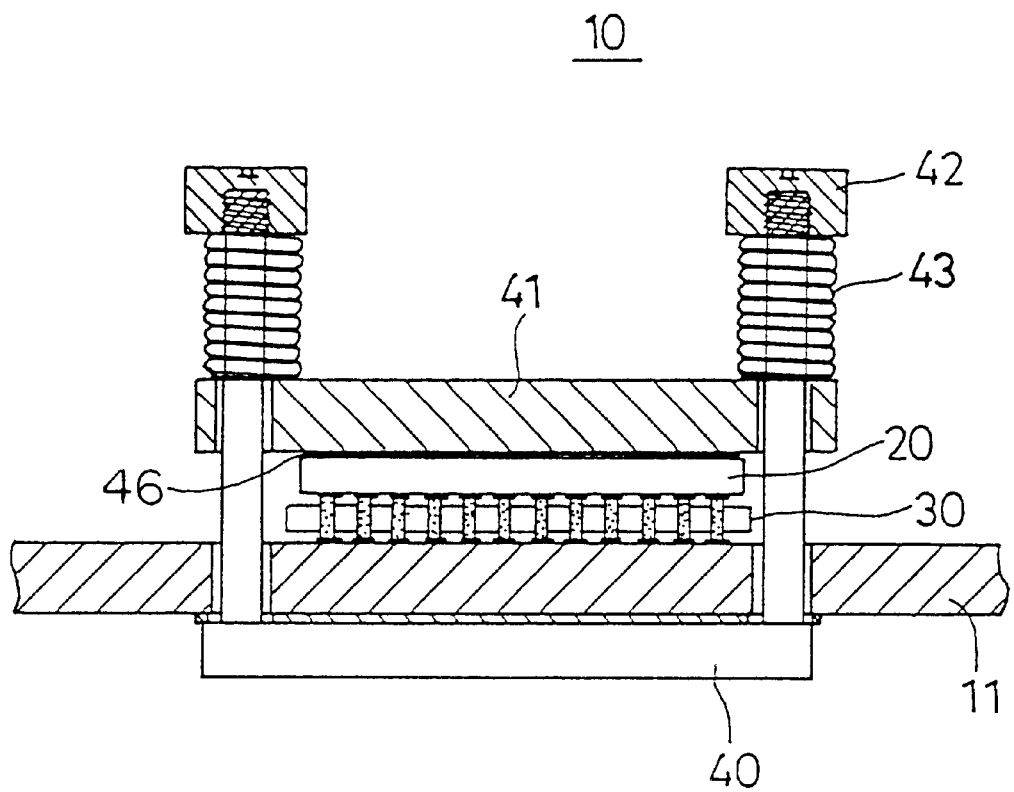
FIG. 1 is a sectional view of a conventional printed board unit.
Figure 2:
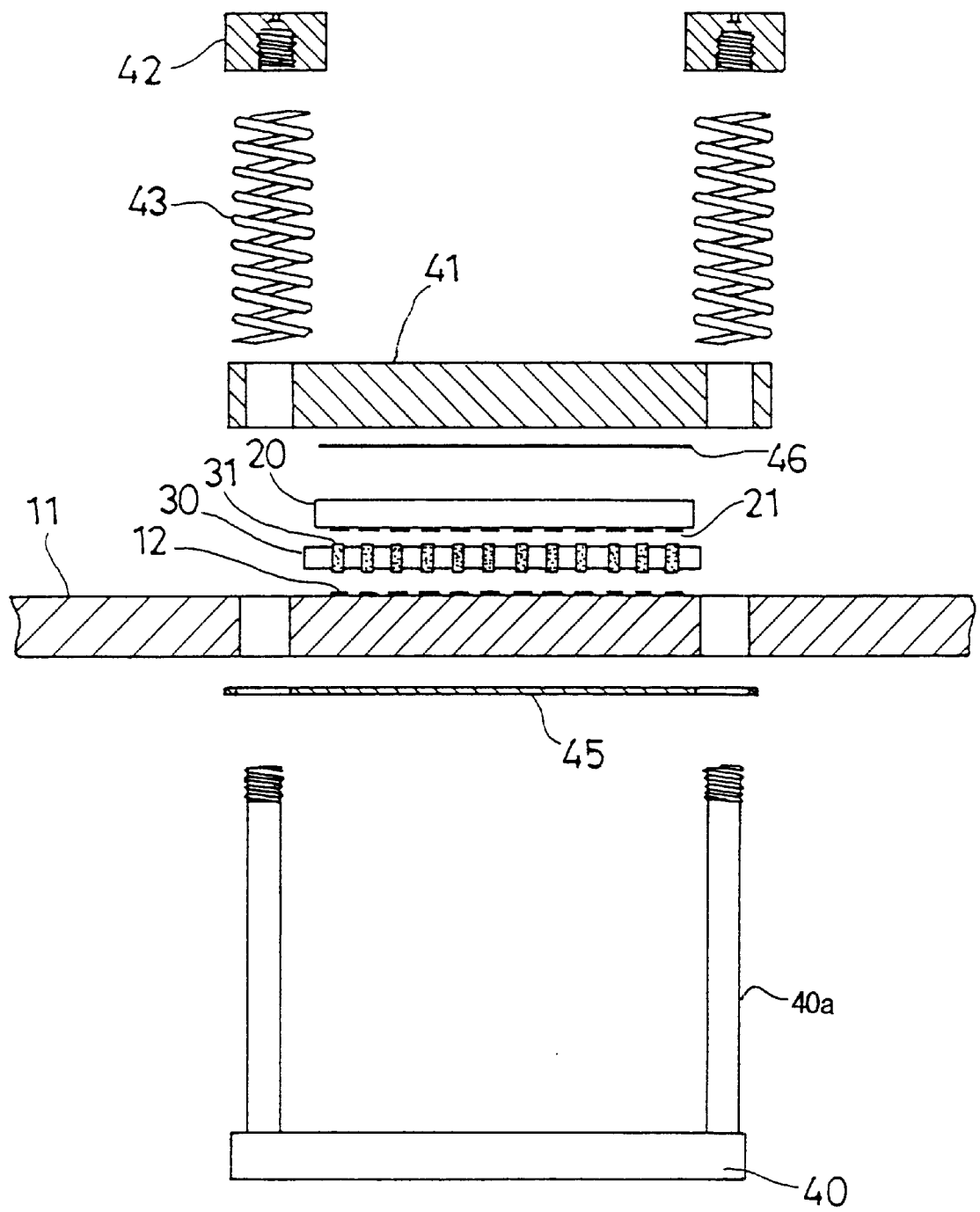
FIG. 2 is an exploded view of the printed board unit of FIG. 1.
Figure 3:
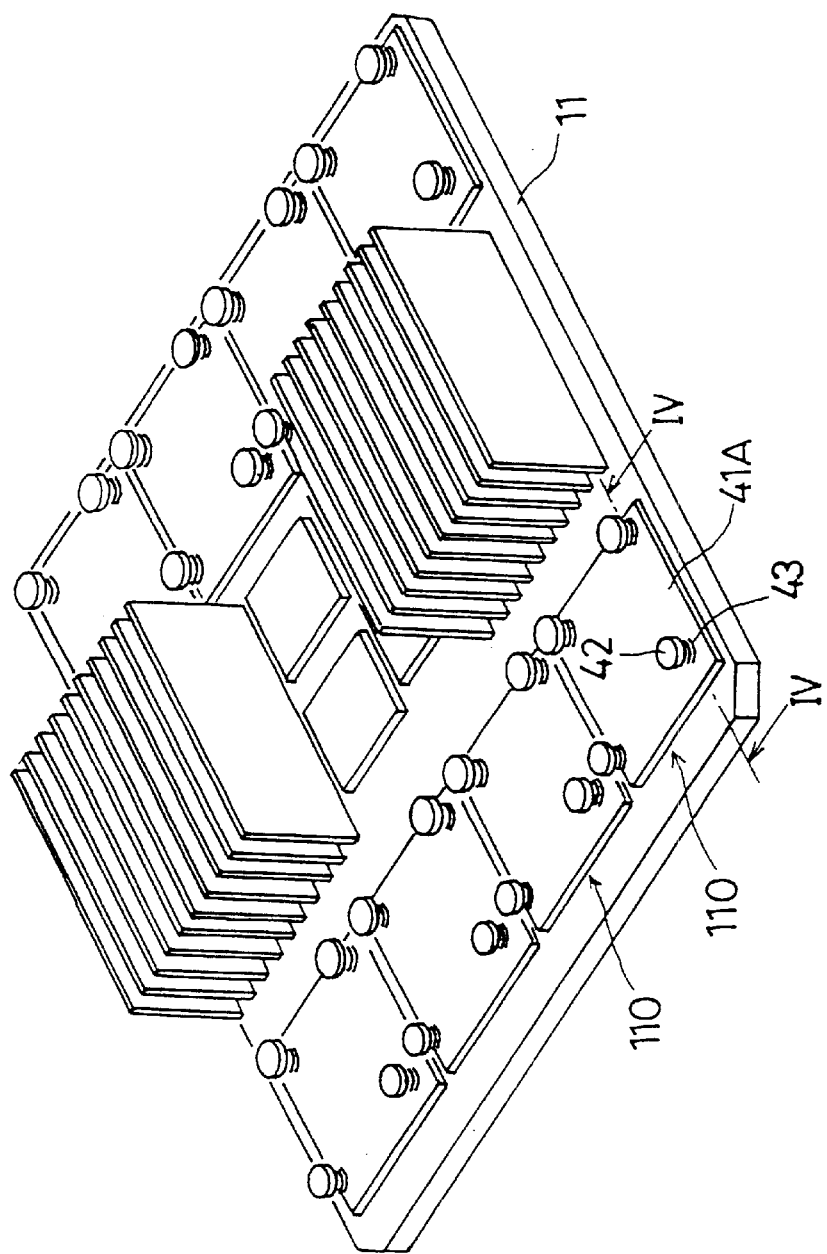
FIG. 3 is a perspective view of a printed board unit according to a first embodiment of the present invention.
Figure 4:
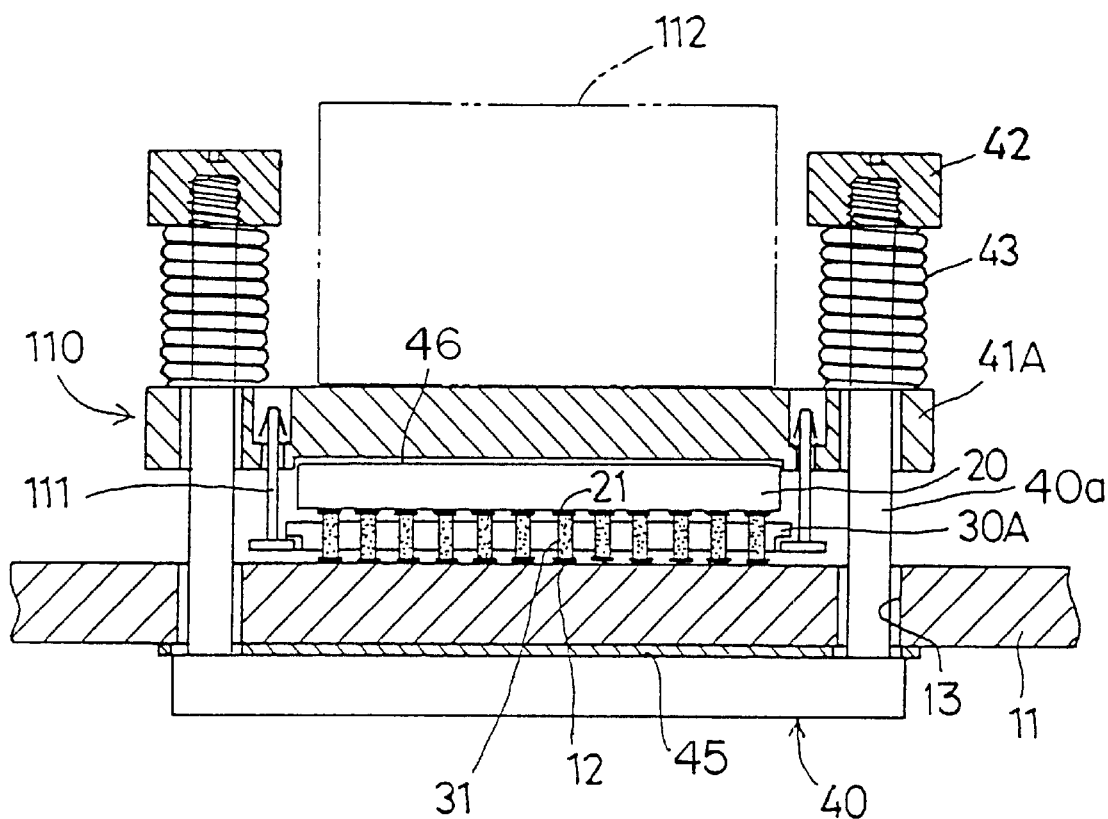
FIG. 4 is an enlarged fragmentary sectional view of the printed board unit of FIG. 3 taken along the line IV—IV.
Figure 5:
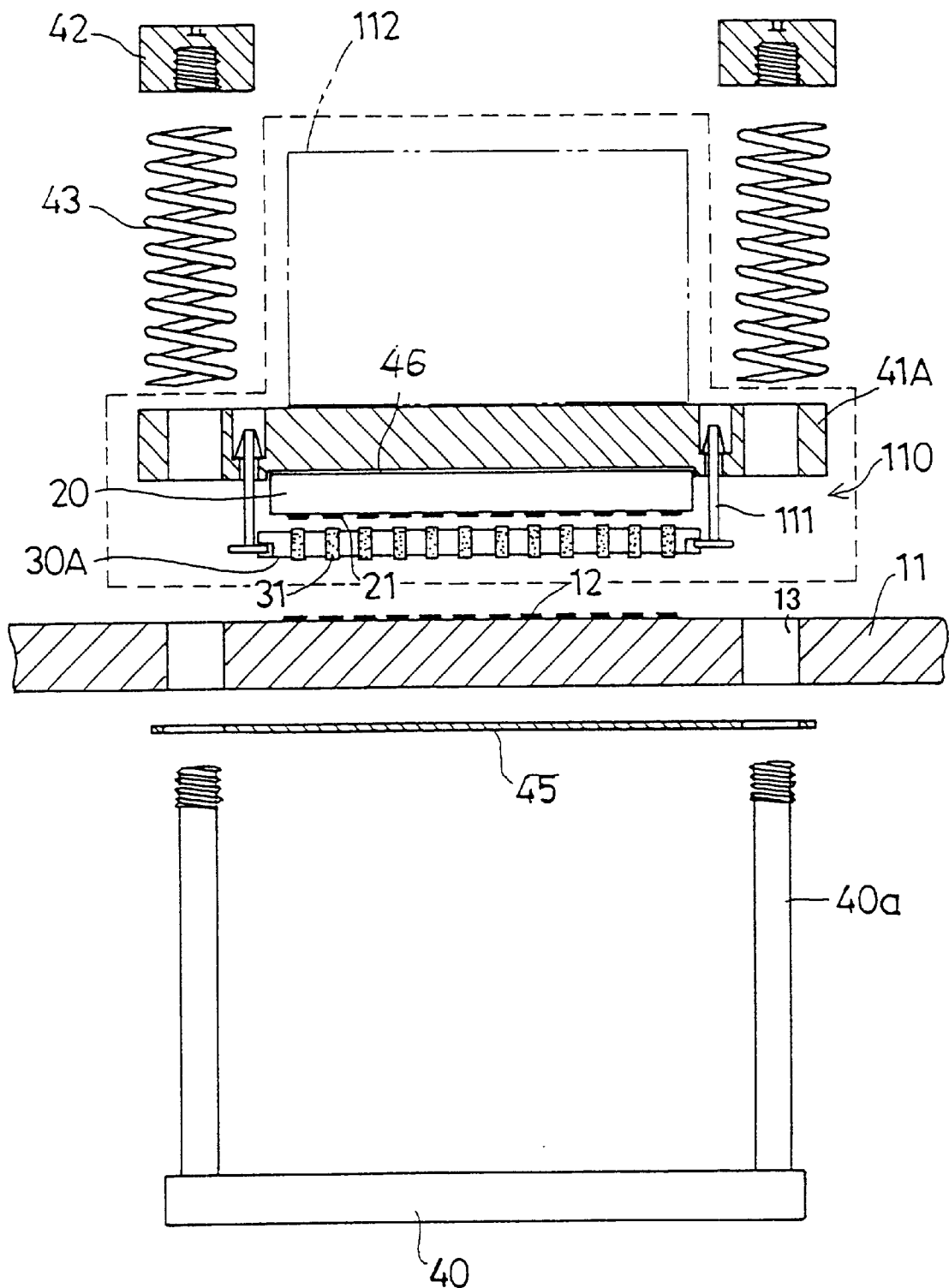
FIG. 5 is an exploded view of the printed board unit of FIG. 4.

FIG. 3 is a diagram showing a printed board unit 100 according to a first embodiment of the present invention. FIG. 4 is an enlarged fragmentary sectional view of the printed board unit 100 taken along the line IV—IV. FIG. 5 is an exploded view of the printed board unit 100 of FIG. 4. In the figures, elements corresponding to those of FIGS. 1 and 2 are referred to by the same numerals.

The printed board unit 100 includes a plurality of semiconductor device units 110 as replacement units arranged on the printed board 11.

In each of parts on which the semiconductor device units 110 are mounted, the stiffener 40 is provided on the lower surface side of the printed board 11 with the insulating sheet 45 interposed therebetween, and the nuts are tightened on the four bolts 40a of the respective corner portions of the stiffener 40 so that each semiconductor device unit 110 is pressed onto the printed board 11 by the coiled springs. Each of the lands 21 of the LSI package 20 is electrically connected to the corresponding one of the lands 12 formed on the printed board 11 via the corresponding one of the contacts 31 of an LGA socket 30A.

A description will now be given of the semiconductor device unit 110.

Figure 6A:
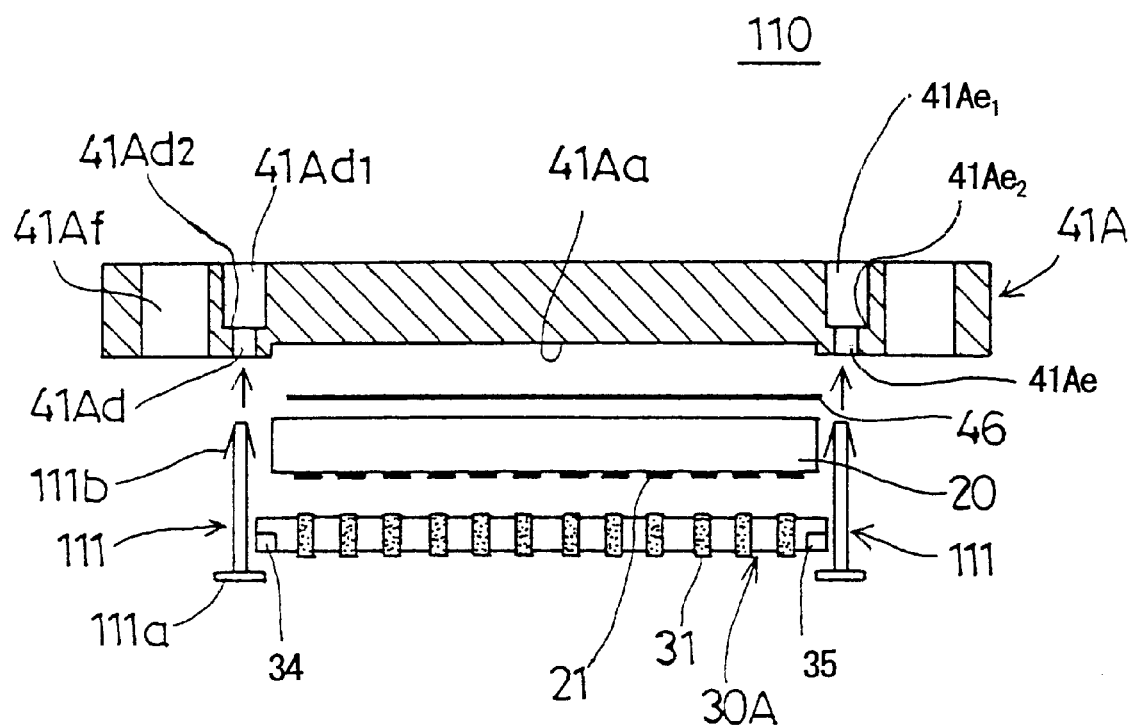
FIGS. 6A and 6B are an exploded sectional view and an exploded perspective view of a semiconductor device unit shown in FIG. 3, respectively.
Figure 6B:
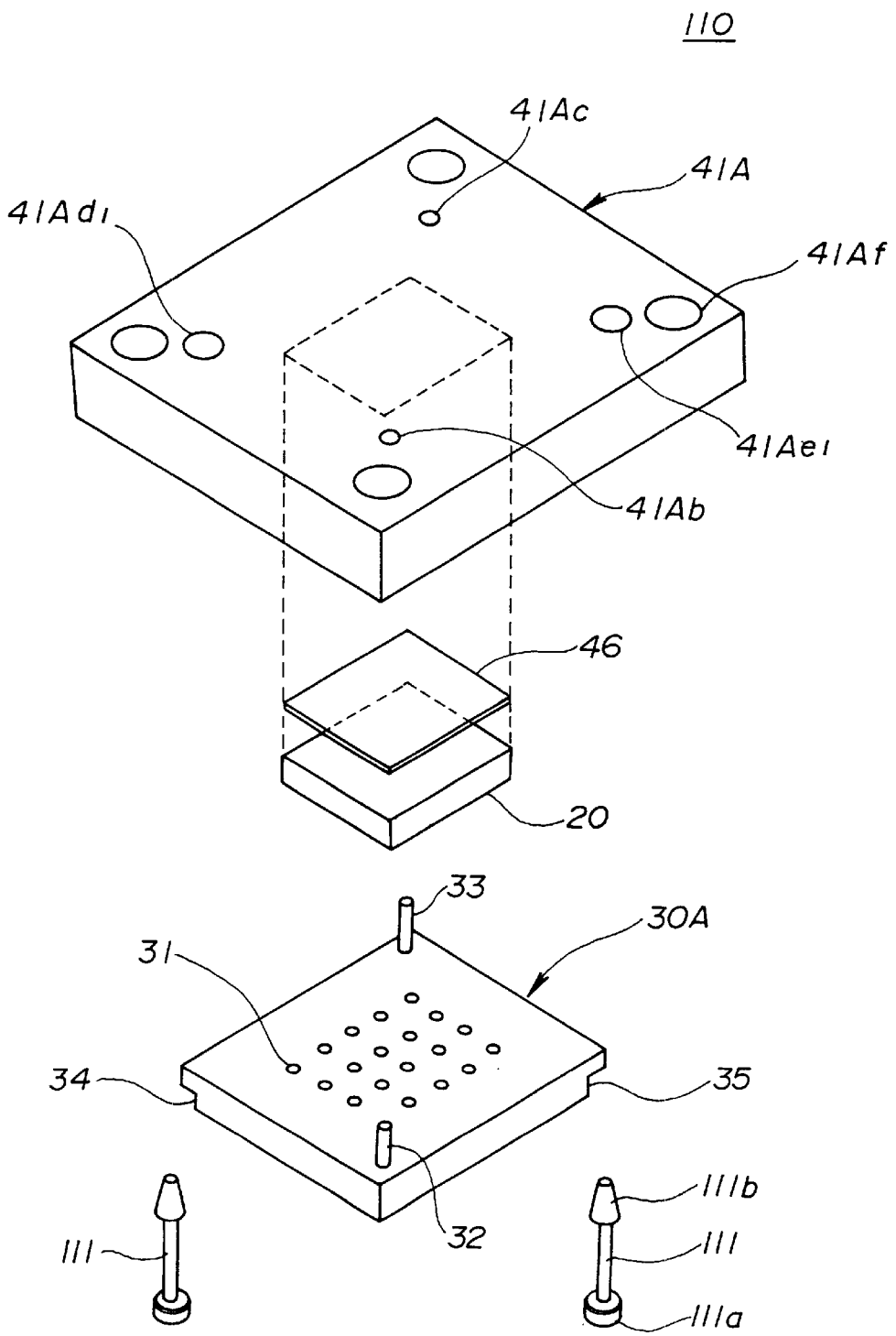
Figure 7A:
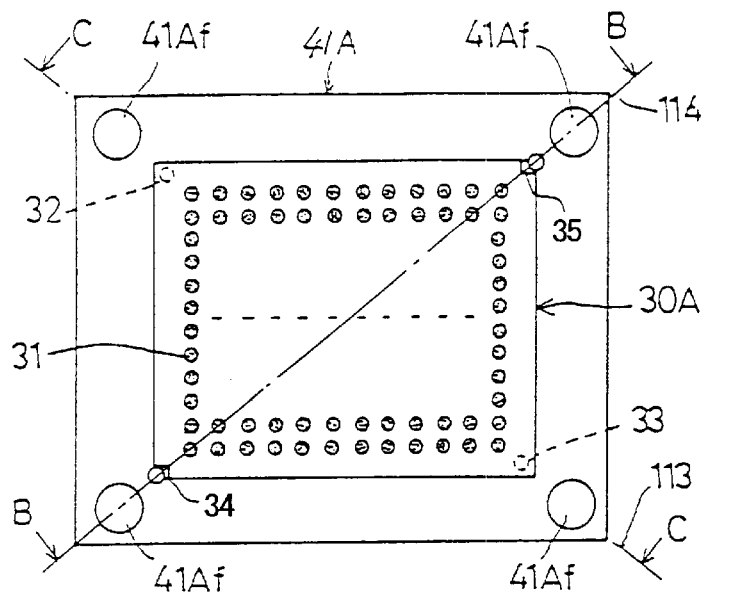
FIG. 7A is a bottom view of the semiconductor device unit shown in FIGS. 6A and 6B.
Figure 7B:
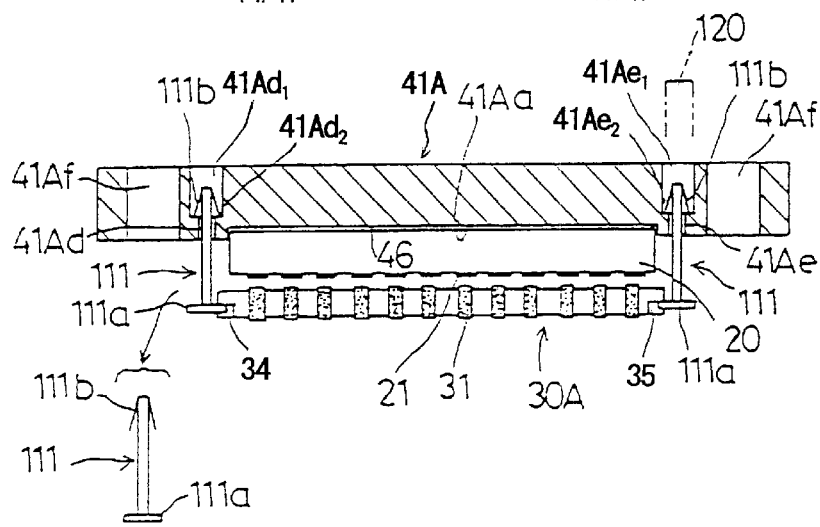
FIGS. 7B and 7C are sectional views of the semiconductor device unit of FIG. 7A taken along the lines B—B and C—C, respectively.
Figure 7C:
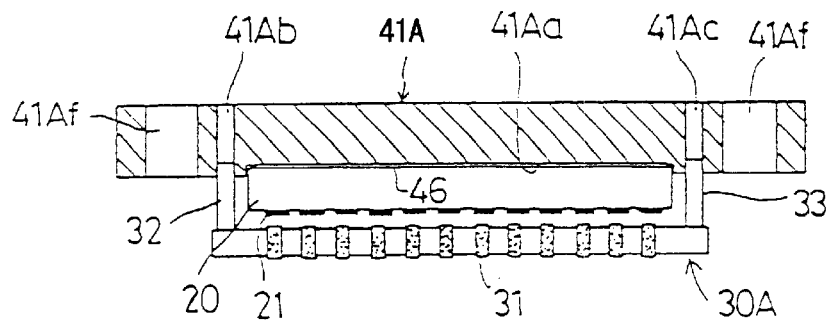

FIGS. 6A and 6B are an exploded sectional view and an exploded perspective view of the semiconductor device unit 110, respectively. FIG. 7A is a bottom view of the semiconductor device unit 110, and FIGS. 7B and 7C are sectional views of the semiconductor device unit 110 of FIG. 7A taken along the lines B—B and C—C, respectively.

As shown in FIGS. 5 and 7A through 7C, each semiconductor device unit 110 includes a heat transfer plate 41A as a base, the LSI package 20 bonded to the lower surface of the heat transfer plate 41A with the heat transfer sheet 46 interposed therebetween, and an LGA socket 30A supported on the lower side of the LSI package 20 by engaging pin members 111. A cooling fin 112 may be attached to the upper surface of the heat transfer plate 41A.

The heat transfer plate 41A includes a shallow concave portion 41Aa for positioning the LSI package 20 and a pair of holes 41Ab and 41Ac for positioning the LGA socket 30A formed in a predetermined arrangement. The pair of the holes 41Ab and 41Ac are positioned around the ends of one diagonal 113 of the rectangular heat transfer plate 41A. Holes 41Ad and 41Ae into which the engaging pin members 111 are fitted are formed around the ends of the other diagonal 114. Through holes 41Af are formed in the respective corner portions of the heat transfer plate 41A.

The LGA socket 30A includes the contacts 31 which correspond to the respective lands 21 of the LSI package 20. Positioning pins 32 and 33 are planted in a pair of diagonal corners of the LGA socket 30. Step-like concave portions 34 and 35 into which flange portions 111a of the engaging pin members 111 are fitted are formed in the other pair of diagonal corners of the LGA socket 30.

Each of the engaging pin members 111 has the flange portion 111a formed on its lower end and an engaging spring 111b of a reverse V-shape on its upper end. The holes 41Ad and 41Ae have hole portions $41Ad_1$ and $41Ae_1$ of larger diameters provided on their upper sides, respectively. The hole portions $41Ad_1$ and $41Ae_1$ include respective bottom portions $41Ad_2$ and $41Ae_2$.

The printed board 11 has the numerous lands 12 and four through holes 13 formed on where the semiconductor device unit 110 is mounted.

The positions of the holes 41Ab and 41Ac correspond to those of the positioning pins 32 and 33, respectively. The positions of the respective through holes 41Af, the respective through holes 13, and the respective bolts 40a correspond to one another.

Here, a further detailed description will be given of the semiconductor device unit 110.

As shown in FIGS. 6A and 6B, and 7A through 7C, the LSI package is fitted into the shallow concave portion 41Aa so as to be positioned with respect to the heat transfer plate 41A. The positioning pins 32 and 33 are fitted into the respective holes 41Ab and 41Ac so that the LGA socket 30 is positioned with respect to the heat transfer plate 41A. Thereby, the respective lands 21 of the LSI package 20 oppose the corresponding contacts 31 of the LGA socket 30.

The engaging pin members 111 are fitted into the respective holes 41A*d* and 41A*e* so that the engaging springs 111*b* protrude through the holes 41A*d* and 41A*e* into the respective hole portions 41A$d_1$ and 41A$e_1$, where the engaging springs 111*b* spread to engage the bottom portions 41A$d_2$ and 41A$e_2$ so as to be prevented from slipping off the hole portions 41A$d_1$ and 41A$e_1$. The flange portions 111*a* of the engaging pin members 111 engage the step-like concave portions 34 and 35, respectively, so that the LGA socket 30 is supported close to the LSI package 20. The contacts 31 and the lands 21 oppose each other with a little space formed therebetween, or the contacts 31 may be in contact with the lands 21.

The semiconductor device unit 110 having the above-described structure is positioned with respect to the printed board 11 with the respective bolts 40*a* penetrating through the through holes 13 to be fitted into the through holes 41A*f*, so that the contacts 31 oppose the lands 12.

With the heat transfer plate 41 pressing the semiconductor device unit 110 onto the printed board 11 by the coiled springs 43, the respective lands 21 of the LSI package 20 are electrically connected to the corresponding lands 12 formed on the printed board 11 via the corresponding contacts 31 of the LGA socket 30A.

The printed board unit 100 having the above-described structure is mounted on a motherboard by being plugged thereinto and is incorporated into a server.

Here, a description will be given of repairs in the event of a failure of the LSI package 20.

The repairs are made in the following procedure. In step 1, the printed board unit 100 is removed outside from the server. In step 2, at the site, after the nuts 42 are loosened and removed, the semiconductor device unit 110 is removed by being pulled up until the bolts 40*a* of the stiffener 40 are pulled out from the through holes 41A*f*. In step 3, a prepared new semiconductor device unit is fitted to the bolts 40*a* from the upper side of the printed board 11, and the coiled springs 43 are fitted to the bolts 40*a* before the nuts 42 are tightened. In step 4, the printed board unit 100 is inserted into the server.

Repairs are also made in the above-described procedure in the event of a failure of the LGA socket 30A.

Therefore, according to this embodiment, a troublesome operation of positioning the LSI package 20 on the LGA socket 30A is unnecessary, and repairs in the event of failures of the LSI package 20 and the LGA socket 30A are made quickly to be completed in shorter times than in a case where the conventional printed board unit is employed. Consequently, a period for which the server operates with a reduced capacity compared with its normal state is shortened compared with the case where the conventional printed board unit is employed.

Further, at the sites of the above-described repairs, dust is prevented from being attached to the lands 21 of the LSI package 20 and the contacts 31 of the LGA socket 30A. Therefore, the reliability of electrical connection between the LSI package 20 and the LGA socket 30A after repair is prevented from being impaired.

Moreover, since it is a semiconductor device unit that is prepared for replacement in the event of a failure, the costs of spare components are low compared with a case where a printed board unit is prepared separately.

The removed semiconductor device unit 110 is sent to a factory, where the removed semiconductor device unit 110 is taken apart so that the faulty LSI package 20 and LGA socket 30A are replaced with new ones, respectively. Then, the semiconductor device unit 110 is again assembled and reproduced. The reason why this reproduction is possible is that the semiconductor device unit 110 is structured so that the LSI package 20 and the LGA socket 30A are removable from the heat transfer plate 41A, respectively, and are detachable from each other.

The reproduction of the semiconductor device unit 110 is performed by means of a cylindrical jig 120 indicated by a double dot chain line in FIG. 7B. The jig 120 is inserted into the hole portion 41A$e_1$ to close the engaging spring 111*b* so that the engaging pin 110 is pulled out. The same operation is performed on the hole portion 41A$d_1$. Then, the faulty LSI package 20 and LGA socket 30A are pulled apart from each other to be replaced with new ones. Thereafter, the semiconductor device unit 110 is again assembled and completed. The operation for this reproduction is performed with the capacity of the server being restored to its normal state. Therefore, the operation does not affect an operational condition of the server, and it does not especially matter if the operation takes time.

Here, a description will be given of the additional installation of an LSI package on the printed board 11.

The printed board 11 has numerous lands and four through holes formed on a part on which the LSI package is to be additionally installed.

The additional installation of the LSI package is performed in the following procedure. In step 1, the printed board unit 100 is removed outside from the server. In step 2, at the site, the stiffener 40 is fitted to the printed board 11 from the lower side thereof, and a semiconductor device unit is fitted to the bolts 40*a* from the upper side of the printed board 11 before the coiled springs 43 are fitted to the bolts 40*a* and the nuts 42 are tightened. In step 3, the printed board unit 100 is inserted into the server.

Therefore, an operation for the additional installation of the LSI package on the printed board 11 is performed quickly to be completed in a shorter time than in a case where the conventional printed board unit is employed. Consequently, a period for which the server operates with a reduced capacity compared with its normal state is shortened compared with the case where the conventional printed board unit is employed.

Since the part of the printed board 11 on which part the LSI package is to be additionally installed has only the numerous lands and the four through holes formed thereon, the production costs of the part are low.

A description will now be given of a variation of the semiconductor device unit 110.

Figure 8A:
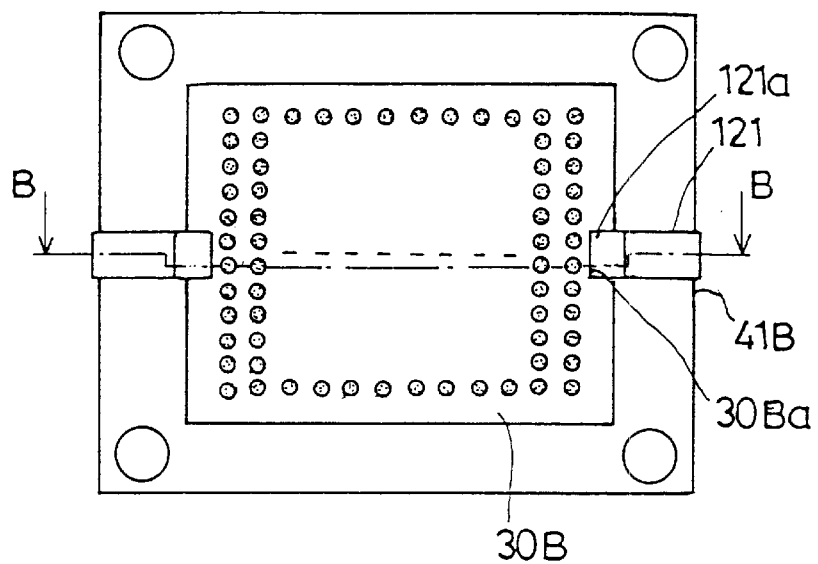
FIG. 8A is a bottom view of a variation of the semiconductor device unit.
Figure 8B:
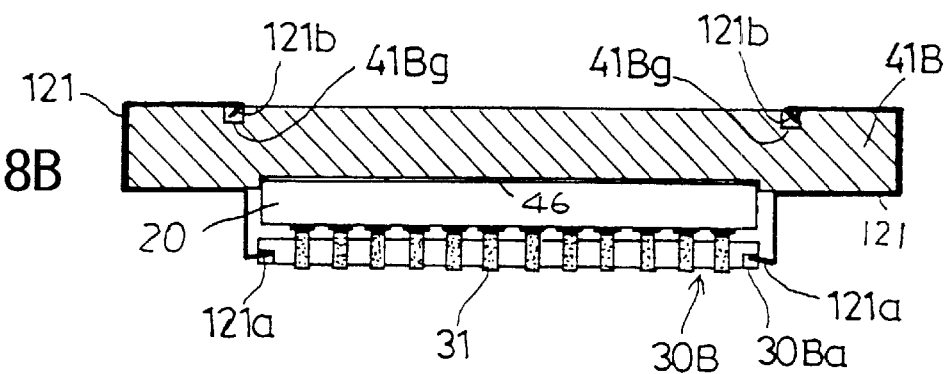
FIG. 8B is a sectional view of the semiconductor device unit of FIG. 8A taken along the line B—B.

FIG. 8A is a bottom view of a semiconductor device unit 110B, which is a variation of the semiconductor device unit 110, and FIG. 8B is a sectional view of the semiconductor device unit 110B of FIG. 8A taken along the line B—B.

The semiconductor device unit 110B employs bent leaf spring members 121 instead of the engaging pins 111 shown in FIG. 7B. Each of the leaf spring members 121 has a hook portion 121*a* of its one end engaged with a concave portion 30B*a* formed on each of the left and right sides of a LGA socket 30B, and a hook portion 121*b* of the other end engaged with a corresponding one of groove portions 41B*g* formed in the upper surface of a heat transfer plate 41B. Thereby, the LSI package 20 and the LGA socket 30B are attached to the lower surface of the heat transfer plate 41B.

A description will now be given of a second embodiment of the present invention.

Figure 9:
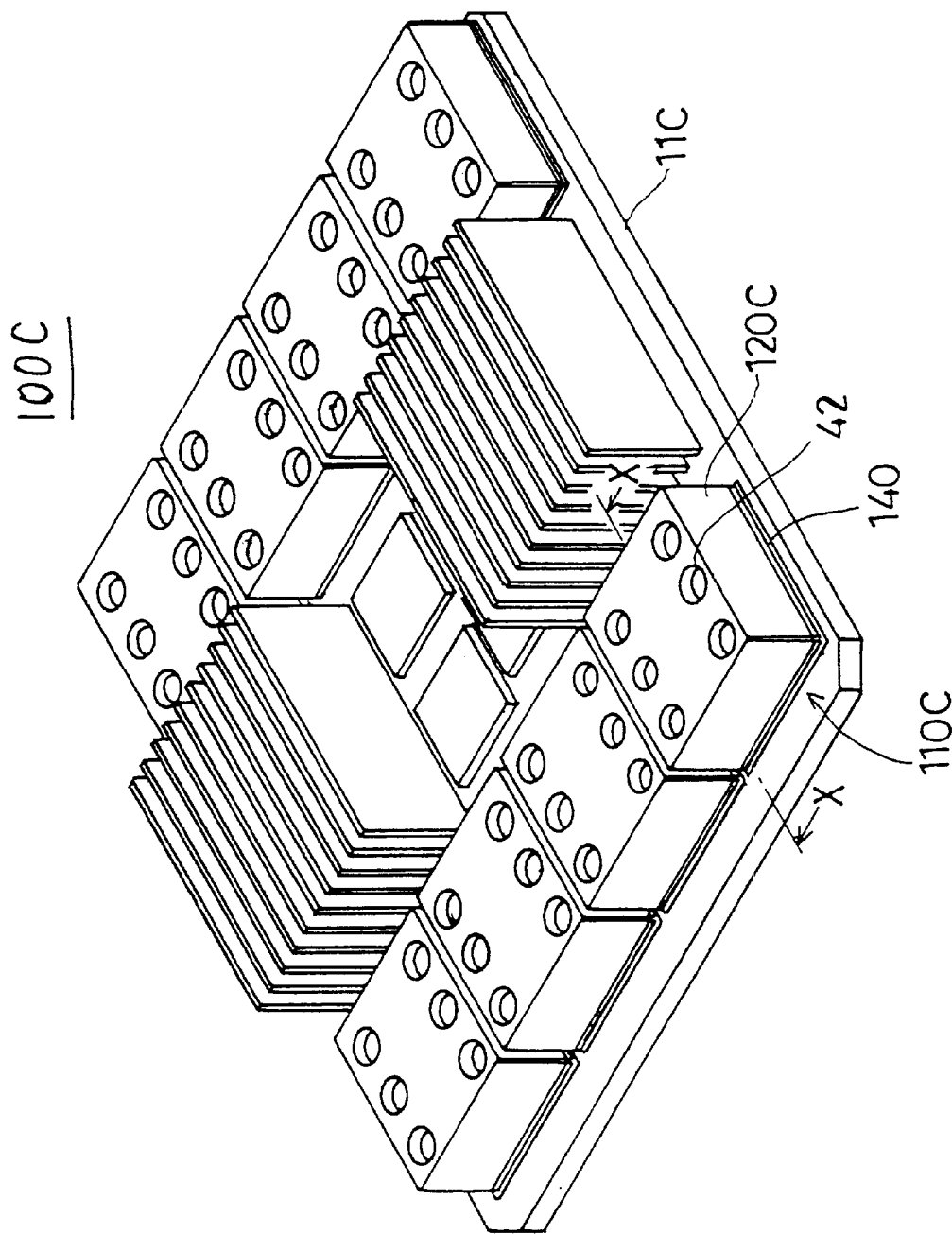
FIG. 9 is a perspective view of a printed board unit according to a second embodiment of the present invention.
Figure 10:
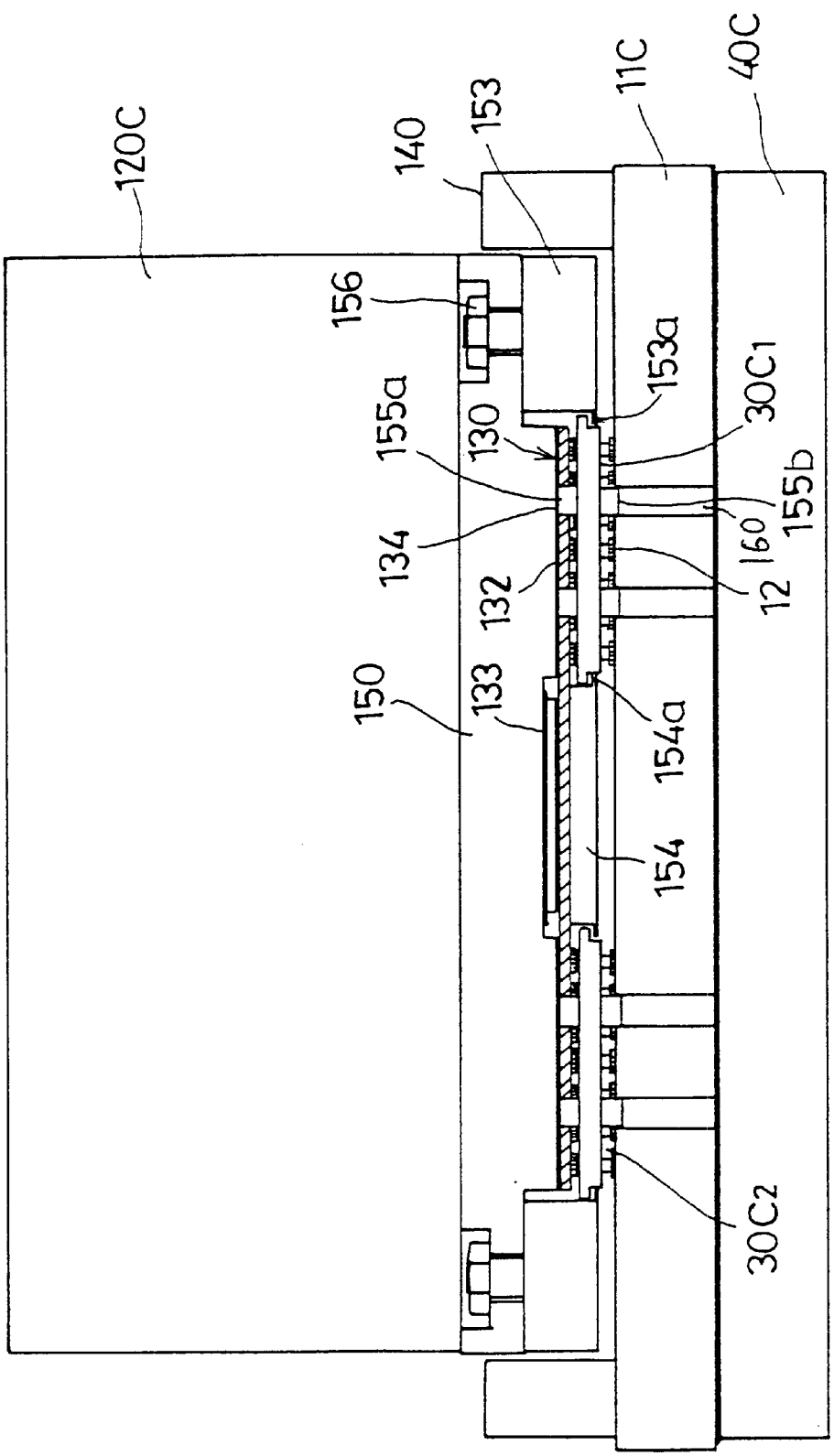
FIG. 10 is an enlarged fragmentary sectional view of the printed board unit of FIG. 9 taken along the line X—X.
Figure 11:
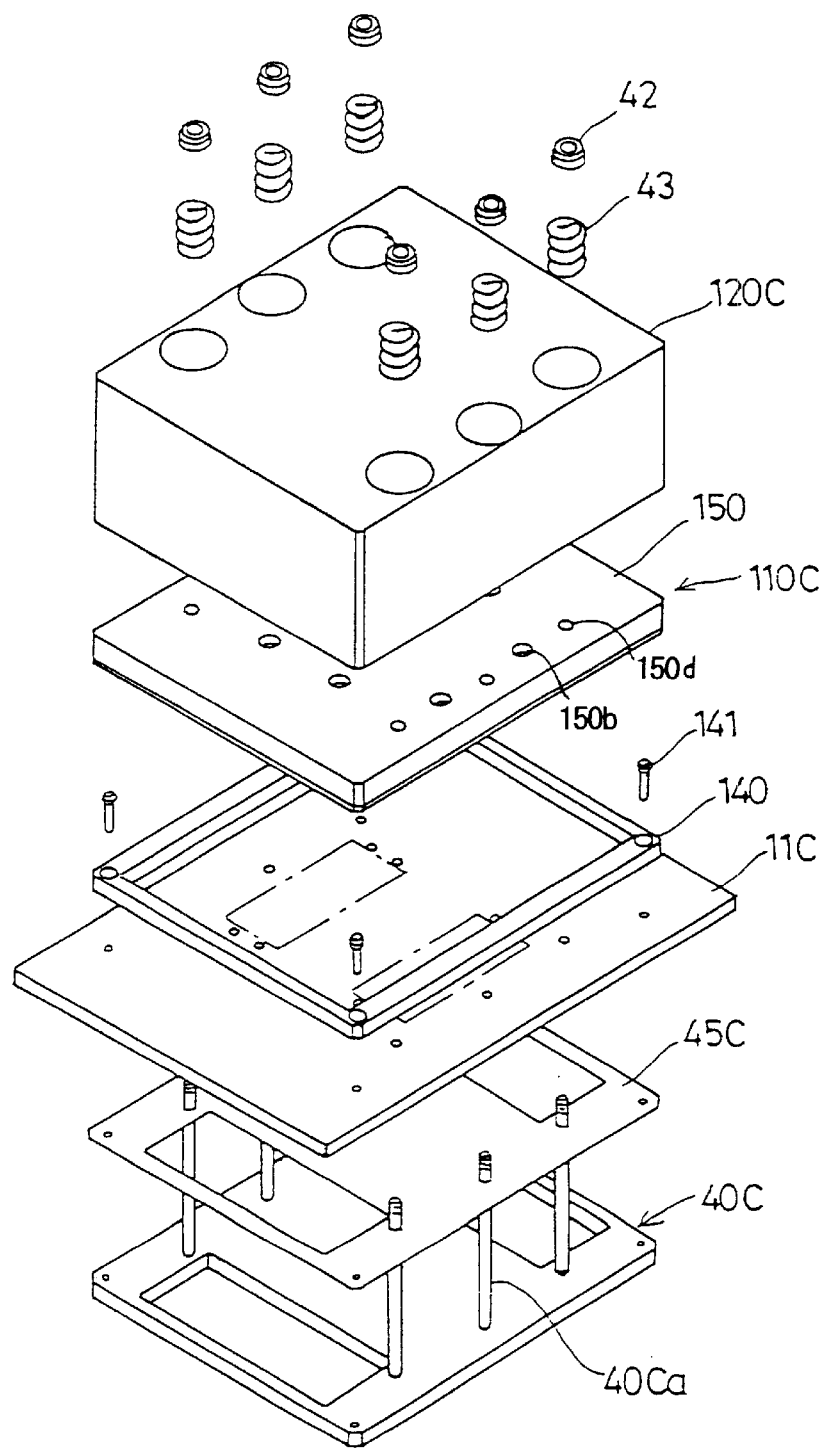
FIGS. 11 and 12 are an exploded perspective view and an exploded sectional view of the printed board unit of FIG. 10, respectively.
Figure 12:
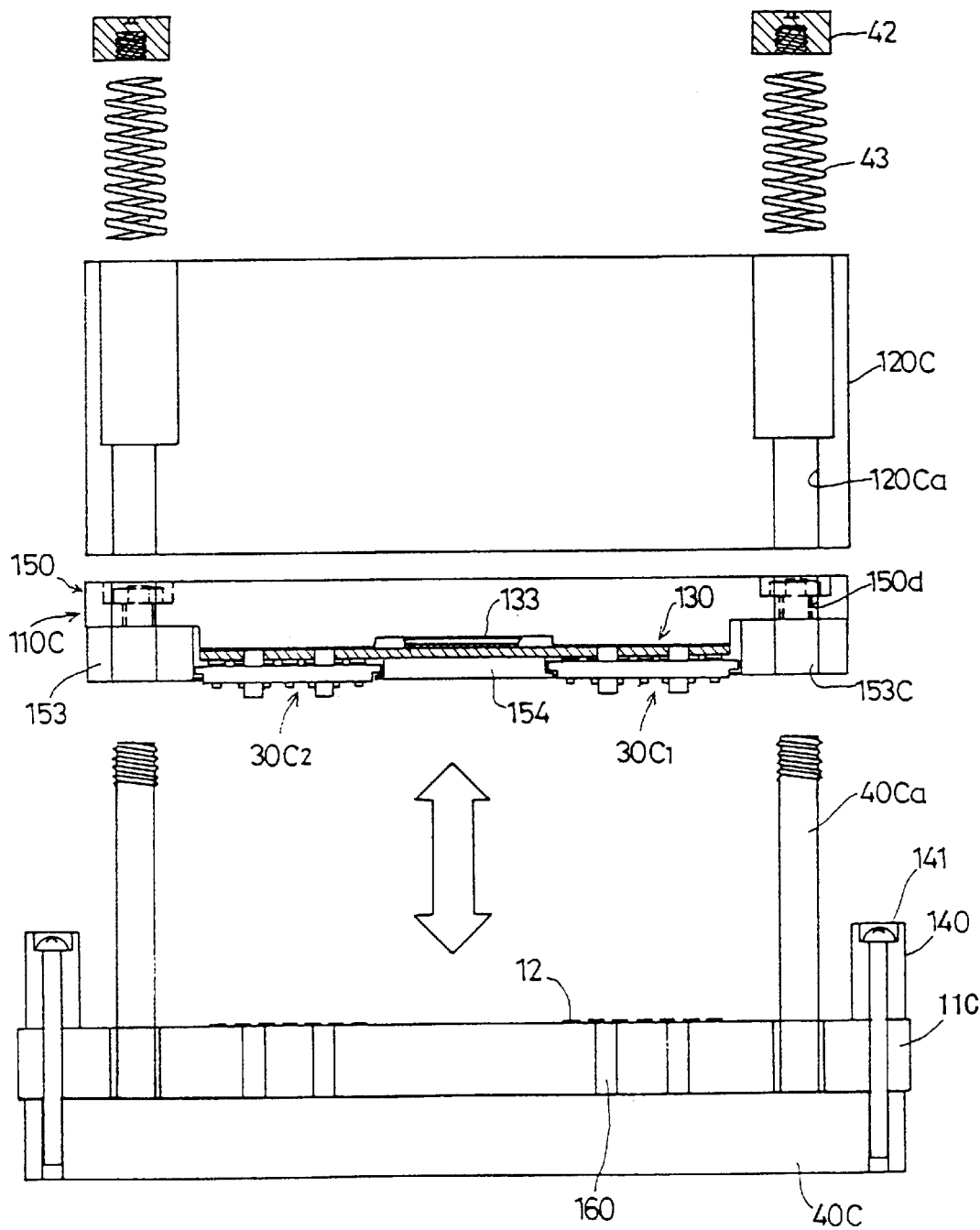

FIG. 9 is a diagram showing a printed board unit 100C according to the second embodiment of the present invention. FIG. 10 is an enlarged fragmentary sectional view of the printed board unit 100C of FIG. 9 taken along the line X—X. FIGS. 11 and 12 are an exploded perspective view and an exploded sectional view of the printed board unit 100C of FIG. 10, respectively. In the figures, elements corresponding to those of FIGS. 1 and 2 are referred to by the same numerals.

According to a structure of the printed board unit 100C, each of semiconductor device units 110C as replacement units mounted on a printed board 11C includes a multi-chip module 130 and LGA sockets $30C_1$ and $30C_2$.

A stiffener 40C is provided on the lower surface side of the printed board 11C with an insulating sheet 45C interposed therebetween, and the nuts 42 are tightened on six bolts 40Ca of the stiffener 40C, so that a cooling fin 120C presses the semiconductor device unit 110C onto the printed board 11C by the coiled springs 43. Respective lands 131 of the multi-chip module 130 are electrically connected to the corresponding lands 12 formed on the printed board 11C via corresponding contacts $31C_1$ and $31C_2$ of the LGA sockets $30C_1$ and $30C_2$.

A guide frame 140 of a quadrilateral frame shape is attached to the upper surface of the printed board 11C by screws 141 so as to enclose a part on which the semiconductor device unit 110 is mounted. The guide frame 140 serves to guide and position the semiconductor device unit 110 to be mounted. The screws 141 are screwed into the stiffener 40C so that the guide frame 140 and the stiffener 40C are fixed to each other with the printed board 11C interposed therebetween.

A description will now be given of the semiconductor device unit 110C.

Figure 13:
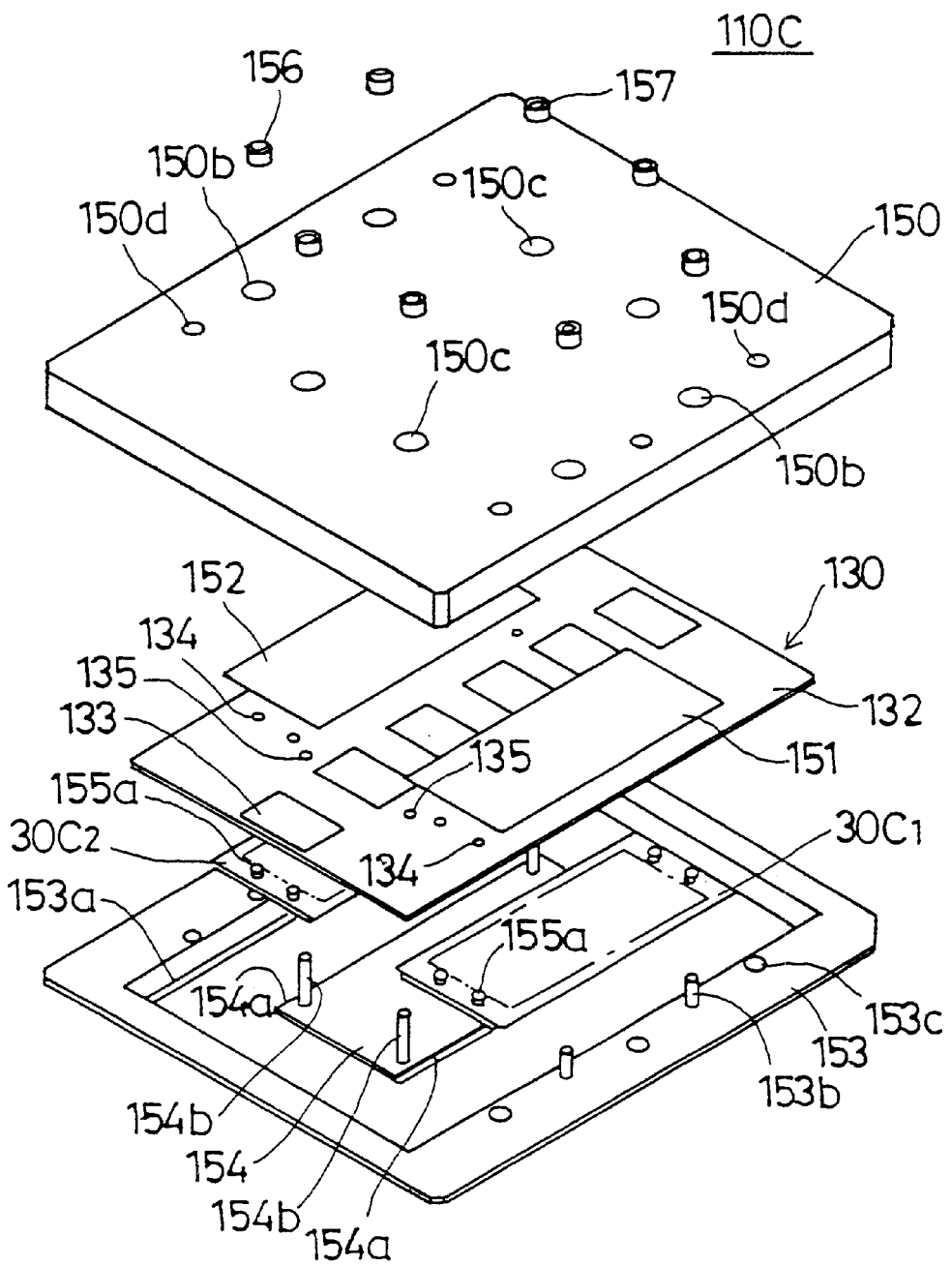
FIGS. 13 and 14 are an exploded perspective view and an exploded sectional view of a semiconductor device unit shown in FIG. 9, respectively.
Figure 14:
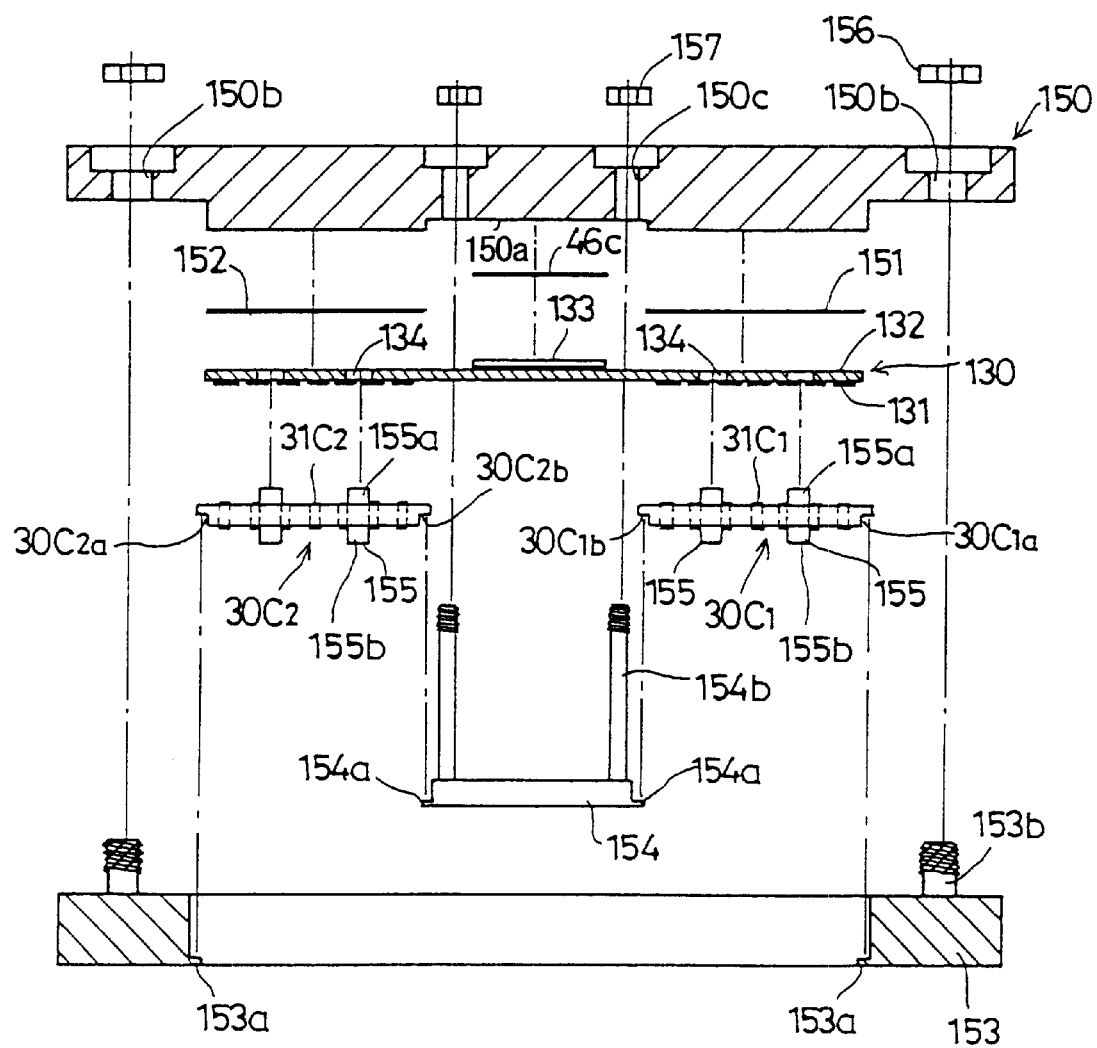

FIGS. 13 and 14 are an exploded perspective view and an exploded sectional view of the semiconductor device unit 110C, respectively.

As shown in FIGS. 12 through 14, the semiconductor device unit 110C includes a heat transfer plate 150 as a base, the multi-chip module 130 bonded to the heat transfer plate 150 with a heat transfer sheet 46C and insulating sheets 151 and 152 on the lower surface side of the heat transfer plate 150 interposed therebetween, the LGA sockets $30C_1$ and $30C_2$ on the lower surface side of the multi-chip module 130, and a frame 153 of a quadrilateral frame shape and a support plate 154 of a quadrilateral shape each supporting the LGA sockets $30C_1$ and $30C_2$ to the heat transfer plate 150.

The heat transfer plate 150 includes a shallow concave portion 150a for receiving an LSI chip 133 on its lower surface, holes 150b for fixing the frame 153, holes 150c for fixing the support plate 154, and holes 150d through which the bolts 40Ca of the stiffener 40C penetrate.

The multi-chip module 130 includes a multilayer substrate 132 having the numerous lands 131 on its lower surface, and a plurality of the bare LSI chips 133 mounted side by side in the center of the upper surface of the multilayer substrate 132. The respected mounted LSI chips 133 are connected to the lands 131 by interconnection lines formed in the multilayer substrate 132. The multilayer substrate 132 has formed therein positioning holes 134 for positioning the LGA sockets $30C_1$ and $30C_2$, and holes 135 through which later-described bolts 154b penetrate.

The LGA sockets $30C_1$ and $30C_2$ each have a rectangular shape, and include the contacts $31C_1$ and $31C_2$, respectively, which penetrate therethrough to correspond to the respective lands 131 of the multi-chip module 130. The LGA sockets $30C_1$ and $30C_2$ further include positioning pins 155. The positioning pins 155 are plated in the respective LGA sockets $30C_1$ and $30C_2$ so as to protrude upward and downward therefrom. Each of the positioning pins 155 includes an upward protruding portion 155a and a downward protruding portion 155b. The LGA socket $30C_1$ includes, along one longitudinal side thereof, a step-like concave portion $30C_1a$ for engaging a corresponding inside holding portion 153a of the frame 153, and, along the other longitudinal side thereof, a step-like concave portion $30C_1b$ for engaging a corresponding concave portion 154a formed on each side of the support plate 154. Similarly, the LGA socket $30C_2$ includes step-like concave portions $30C_2a$ and $30C_2b$ corresponding to the step-like concave portions $30C_1a$ and $30C_1b$ of the LGA socket $30C_1$, respectively.

Bolts 153b are planted in the frame 153 so as to protrude upward therefrom, and holes 153c through which the bolts 40Ca of the stiffener 40C penetrate are formed in the frame 153. The bolts 154b are planted in the support plate 154 so as to protrude upward therefrom.

As shown in FIG. 12, the printed board 11C has the numerous lands 12 formed on the part on which the semiconductor device unit 110C is mounted, and the six through holes 13 formed in correspondence to the bolts 40Ca of the stiffener 40C. The printed board 11C further has through holes 160 formed in correspondence to the downward protruding portions 155b of the positioning pins 155 of the LGA sockets $30C_1$ and $30C_2$.

Here, a further detailed description will be given of the semiconductor device unit 110C.

The semiconductor device unit 110C has a structure shown in FIGS. 12 through 14. The multi-chip module 130 is fixed to the lower surface of the heat transfer plate 150. The LSI chip 133 is received by the shallow concave portion 150a to be bonded thereto with the heat transfer sheet 46C interposed therebetween. The insulating sheets 151 and 152 are interposed between the multilayer substrate 132 and the heat transfer plate 150. The frame 153 is attached to the heat transfer plate 150 with nuts 156 being screwed on the bolts 153b inserted into the holes 150b of the heat transfer plate 150. The support plate 154 is attached to the heat transfer plate 150 with nuts 157 being screwed on the bolts 154b inserted into the holes 150c of the heat transfer plate 150. The LGA sockets $30C_1$ and $30C_2$ have the respective step-like concave portions $30C_1a$ and $30C_2a$ supported by the holding portions 153a of the frame 153, and the respective step-like concave portions $30C_1b$ and $30C_2b$ supported by the holding portions 154a of the support plate 154. The LGA sockets $30C_1$ and $30C_2$ are positioned with respect to the multi-chip module 130 with the upward protruding portions 155a being fitted into the positioning holes 134 of the multi-chip module 130 so that the upper ends of the respective contacts $31C_1$ and $31C_2$ oppose the corresponding lands 131 of the multi-chip module 130. The holes 153c of the frame 153 correspond to the holes 150d of the heat transfer plate 150.

As shown in FIG. 12, the semiconductor device unit 110C having the above-described structure and the cooling fin 120C are fixed on the printed board 11C. The semiconductor device unit 110C is fitted inside the guide frame 140 with the bolts 40Ca of the stiffener 40 being fitted into the holes 153c and 153d, and is positioned on the printed board 11C with the downward protruding portions 155b being inserted into the through holes 160. The contacts $31C_1$ and $31C_2$ oppose the lands 131. The bolts 40Ca are fitted into through holes 120Ca of the cooling fin 120C, and have the nuts 42 tightened thereon. The cooling fin 120C presses the semiconductor device unit 110C onto the printed board 11C by resilient force of the coiled springs 43. The respective lands 131 of the multi-chip module 130 are electrically connected to the lands 12 formed on the printed board 11C via the corresponding contacts $31C_1$ and $31C_2$ of the LGA sockets $30C_1$ and $30C_2$.

According to this embodiment, since the upward and downward protruding portions 155a and 155b of the same positioning pin 155 are employed for positioning, the positions of the lands 131 of the multi-chip module 130, the positions of the contacts $31C_1$ and $31C_2$ of the LGA sockets $30C_1$ and $30C_2$, and the positions of the lands 12 of the printed board 11C are matched with accuracy.

The printed board unit 100C having the above-described structure is mounted on a mother board by being plugged thereinto, and is incorporated into a server.

Here, a description will be given of repairs in the event of a failure of the multi-chip module 130.

The repairs are made in the following procedure. In step 1, the printed board unit 100C is removed outside from the server. In step 2, at the site, after the nuts 42 are loosened and removed, the cooling fin 120C and the semiconductor device unit 110C are pulled out from the bolts 40Ca of the stiffener 40C to be removed. In step 3, a prepared new semiconductor device unit and the cooling fin 120C are fitted to the bolts 40Ca from the upper side of the printed board 11C, and the coiled springs 43 are fitted to the bolts 40Ca before the nuts 42 are tightened. In step 4, the printed board unit 100C is inserted into the server.

Repairs are also made in the above-described procedure in the event of a failure of the LGA sockets $30C_1$ or $30C_2$.

Therefore, repairs in the event of failures of the multi-chip module 130 and the LGA socket $30C_1$ or $30C_2$ are made quickly to be completed in shorter times than in a case where the conventional printed board unit is employed. Consequently, a period for which the server operates with a reduced capacity compared with its normal state is shortened compared with the case where the conventional printed board unit is employed.

Further, at the sites of the above-described repairs, dust is prevented from being attached to the lands 131 of the multi-chip module 130 and the contacts $31C_1$ or $31C_2$ of the LGA socket $30C_1$ or $30C_2$. Therefore, the reliability of electrical connection between the multi-chip module 130 and the LGA socket $30C_1$ or $30C_2$ after repair is prevented from being impaired.

Moreover, since it is a semiconductor device unit that is prepared for replacement in the event of a failure, the costs of spare components are low compared with a case where a printed board unit is prepared separately.

The removed semiconductor device unit 110C is sent to a factory, where the removed semiconductor device unit 110 is taken apart by loosening and removing the nuts 156 and 157 so that the faulty multi-chip module 130 and LGA socket $30C_1$ or $30C_2$ are replaced with new ones, respectively. Then, the semiconductor device unit 110C is again assembled and reproduced.

Here, a description will be given of the additional installation of a multi-chip module on the printed board 11C.

The printed board 11C has numerous lands and six through holes formed on a part on which the multi-chip module is to be additionally installed.

The additional installation of the multi-chip module is performed in the following procedure. In step 1, the printed board unit 100C is removed outside from the server. In step 2, at the site, the stiffener 40C is fitted to the printed board 11C from the lower side thereof, and the guide frame 140 is placed on the upper surface of the printed board 11 to be fixed thereto by the screws 141. In step 3, a semiconductor device unit and the cooling fin 120C are fitted to the bolts 40Ca before the coiled springs 43 are fitted to the bolts 40Ca and the nuts 42 are tightened. In step 4, the printed board unit 100C is inserted into the server.

Therefore, an operation for the additional installation of the multi-chip module on the printed board 11C is performed quickly to be completed in a shorter time than in a case where the conventional printed board unit is employed. Consequently, a period for which the server operates with a reduced capacity compared with its normal state is shortened compared with the case in which the conventional printed board unit is employed.

Further, since it is a semiconductor device unit that is prepared for additional installment, the costs of spare components are low compared with a case where a printed board unit is prepared separately.

Moreover, since the part of the printed board 11C on which part the multi-chip module is to be additionally installed has only the numerous lands and the six through holes formed thereon, the production costs of the part are low.

The present invention is not limited to the specifically disclosed embodiments, but variations and modifications may be made without departing from the scope of the present invention.

The present application is based on Japanese priority application No. 2000-291143 filed on Sep. 25, 2000, the entire contents of which are hereby incorporated by reference.

What is claimed is:

1. A printed board unit, comprising:
    a printed board including lands thereon;
    a semiconductor device unit; and
    an attachment mechanism to attach said semiconductor device unit to said printed board, wherein said semiconductor device unit further comprises:
        a heat transfer member,
        a semiconductor device including first and second surfaces parallel to each other, the first surface having lands thereon, and
        a socket including contacts protruding from first and second surfaces of said socket, the first and second surfaces being parallel to each other, wherein:
            said semiconductor device and said socket are attached to and supported by said heat transfer member so that the second surface of said semiconductor device opposes said heat transfer member, and
            the lands of said semiconductor device are electrically connected to the lands of said printed board unit via the contacts of said socket.

2. The printed board unit as claimed in claim 1, wherein said semiconductor device unit further comprises:
    a support mechanism which supports said semiconductor device and said socket so that said semiconductor device and said socket are removable from said heat transfer member.

3. The printed board unit as claimed in claim 2, wherein said support mechanism comprises:
    fasteners each having a first end portion engaging said heat transfer member and a second end portion engaging said socket so that said socket is fixed to said heat transfer member;

receiving portions for receiving the first end portions of said fasteners, the receiving portions being formed in said heat transfer member; and concave portions for receiving the second end portions of said fasteners, the concave portions being formed on the second surface of said socket.

4. The printed board unit as claimed in claim 3, wherein:

each of the first end portions of said fasteners is a spring member and each of the second end portions thereof is a flange; and each of said receiving portions is a hole.

5. The printed board unit as claimed in claim 3, wherein:

each of said fasteners is a spring member; and each of said receiving portions is a concave portion.

6. The printed board unit as claimed in claim 1, wherein said semiconductor device unit further comprises:

a concave portion for positioning said semiconductor device with respect to said heat transfer member, the concave portion being formed in said transfer member; and a first positioning mechanism for positioning said socket with respect to said heat transfer member.

7. The printed board unit as claimed in claim 6, wherein said first positioning mechanism comprises:

holes formed in said heat transfer member; and pins provided on said socket, wherein said pins are inserted into said corresponding holes.

8. The printed board unit as claimed in claim 6, further comprising:

a second positioning mechanism for positioning said semiconductor device unit with respect to said printed board.

9. The printed board unit as claimed in claim 8, wherein said second positioning mechanism comprises:

first holes formed in said printed board;

second holes formed in said heat transfer member; and pole members, wherein said pole members penetrate through said corresponding first and second holes.

10. The printed board unit as claimed in claim 1, wherein said semiconductor device unit further comprises:

a first positioning mechanism for positioning said socket with respect to said semiconductor device.

11. The printed board unit as claimed in claim 10, wherein:

said socket further comprises positioning pins each being fixed therein so as to have a first portion thereof protruding in a direction of the first surface of said socket; and said first positioning mechanism comprises:

holes formed in said semiconductor device; and the first portions of said positioning pins, wherein said first portions are fitted into the corresponding holes.

12. The printed board unit as claimed in claim 10, further comprising:

a second positioning mechanism for positioning said semiconductor device unit with respect to said printed board.

13. The printed board unit as claimed in claim 11, further comprising:

a second positioning mechanism for positioning said semiconductor device unit with respect to said printed board.

14. The printed board unit as claimed in claim 12, wherein:

said socket further comprises positioning pins each being fixed therein so as to have a second portion thereof protruding in a direction of the second surface of said socket; and said second positioning mechanism comprises:

holes formed in said printed board; and the second portions of said positioning pins, wherein said second portions are fitted into the corresponding holes.

15. The printed board unit as claimed in claim 13, wherein:

each of said positioning pins further comprises a second portion protruding in a direction of the second surface of said socket; and said second positioning mechanism comprises:

holes formed in said printed board; and the second portions of said positioning pins, wherein said second portions are fitted into the corresponding holes.

16. A printed board unit, comprising:

a printed board having a first main surface with lands thereon;

a semiconductor device unit, comprising:

a heat transfer member, a semiconductor device having first and second parallel main surfaces with lands on the first surface thereof, a socket having parallel first and second surfaces with respective contacts protruding from the first and second surfaces, and fasteners removably attaching the socket to the heat transfer member with the semiconductor device therebetween and with the first surface of the semiconductor device opposing the heat transfer member and with the lands of the second surface thereof aligned with and contacting corresponding contacts protruding from the first surface of the socket; and an attachment mechanism attaching the semiconductor device unit to the printed circuit board such that the contacts of the second surface of the socket are aligned with and contact corresponding lands of the printed board.

17. The printed board unit as recited in claim 16, wherein:

a surface of the heat transfer member opposing the semiconductor device is of larger dimensions than the first opposing surface of the semiconductor device and includes a recess therein within which at least a portion of the semiconductor device is received.

18. The printed board unit as recited in claim 16, wherein the socket is attached to the heat transfer member by elongated pins having flanged heads engaging peripheral portions of the socket and spring loaded ends received through corresponding, aligned apertures in the heat transfer member and releasably engaging same to attach the semiconductor device and socket to the heat transfer member.

19. The printed board unit as recited in claim 16, wherein the attachment mechanism comprises threaded studs extending through aligned corresponding apertures in the printed board and the frame member with nuts on the ends thereof securing the heat transfer member to the printed board.

20. The printed board unit as recited in claim 19, further comprising resilient urging elements on the studs, between the nuts and the heat transfer member, to apply a resilient compressive force between the frame member and the printed board.

* * * * *